(12) United States Patent
McClelland et al.

(10) Patent No.: US 10,832,894 B2
(45) Date of Patent: Nov. 10, 2020

(54) PLASMA GENERATING SYSTEM HAVING THERMAL BARRIER BETWEEN PLASMA REACTOR AND WAVEGUIDE

(71) Applicant: ReCarbon, Inc., Santa Clara, CA (US)

(72) Inventors: Stefan Andrew McClelland, San Jose, CA (US); George Stephen Leonard, III, Oakland, CA (US); Jae Mo Koo, Palo Alto, CA (US)

(73) Assignee: RECARBON, INC., Santa Clara, CA (US)

( * ) Notice: Subject to any disclaimer, the term of this patent is extended or adjusted under 35 U.S.C. 154(b) by 0 days.

(21) Appl. No.: 16/803,969

(22) Filed: Feb. 27, 2020

(65) Prior Publication Data

US 2020/0312628 A1   Oct. 1, 2020

Related U.S. Application Data

(60) Provisional application No. 62/823,436, filed on Mar. 25, 2019, provisional application No. 62/823,492, filed on Mar. 25, 2019, provisional application No. 62/823,505, filed on Mar. 25, 2019, provisional application No. 62/823,508, filed on Mar. 25, 2019, provisional application No. 62/823,514, filed on Mar. 25, 2019, provisional application No. 62/823,517,
(Continued)

(51) Int. Cl.
| | |
|---|---|
| *H01J 7/24* | (2006.01) |
| *H01J 37/32* | (2006.01) |
| *C23C 16/511* | (2006.01) |
| *H05H 1/46* | (2006.01) |

(52) U.S. Cl.
CPC ...... *H01J 37/32229* (2013.01); *C23C 16/511* (2013.01); *H01J 37/32449* (2013.01); *H05H 1/46* (2013.01); *H01J 37/32192* (2013.01); *H01J 37/32513* (2013.01)

(58) Field of Classification Search
CPC .......... H01J 37/32192; H01J 37/32229; H01J 37/32513
See application file for complete search history.

(56) References Cited

U.S. PATENT DOCUMENTS

| | | | | |
|---|---|---|---|---|
| 5,125,358 A | * | 6/1992 | Ueda ................. | H01J 37/32678 118/723 MR |
| 5,397,448 A | * | 3/1995 | Gesche ............... | H01J 37/3452 204/298.16 |

(Continued)

FOREIGN PATENT DOCUMENTS

| | | |
|---|---|---|
| KR | 10-2017-0006007 A | 1/2017 |
| WO | 2012-084659 A2 | 6/2012 |

*Primary Examiner* — Thuy Vinh Tran
(74) *Attorney, Agent, or Firm* — Patent Office of Dr. Chung Park

(57) ABSTRACT

A plasma generating system includes a waveguide for transmitting a microwave energy therethrough and an inner wall disposed within the waveguide to define a plasma cavity, where a plasma is generated within the plasma cavity using the microwave energy. The plasma generating system further includes: an adaptor mounted on a first side of the waveguide and physically separated from the waveguide by a first gap and having a gas outlet through which a gas processed by the plasma exits the plasma cavity; and an EM seal disposed in the first gap and configured to block leakage of the microwave energy through the first gap.

28 Claims, 11 Drawing Sheets

Related U.S. Application Data filed on Mar. 25, 2019, provisional application No. 62/823,484, filed on Mar. 25, 2019.

(56) References Cited

U.S. PATENT DOCUMENTS

| | | | |
|---|---|---|---|
| 6,603,269 B1* | 8/2003 | Vo | H01J 37/32192 |
| | | | 118/723 ME |
| 8,633,648 B2 | 1/2014 | Tanibata et al. | |
| 9,144,858 B2* | 9/2015 | Lee | B23K 10/00 |
| 9,699,880 B2* | 7/2017 | Lee | H05H 1/48 |
| 2002/0043342 A1 | 4/2002 | Taniguchi | |
| 2004/0149697 A1 | 8/2004 | Gonzalez | |
| 2009/0255324 A1 | 10/2009 | Ishibashi | |
| 2012/0186747 A1* | 7/2012 | Obama | H01J 37/32284 |
| | | | 156/345.42 |

* cited by examiner

PLASMA GENERATING SYSTEM HAVING THERMAL BARRIER BETWEEN PLASMA REACTOR AND WAVEGUIDE

CROSS-REFERENCE TO PRIOR APPLICATIONS

This application claims priority of U.S. Patent Application Nos. 62/823,436; 62/823,492; 62/823,505; 62/823,508; 62/823,514; 62/823,517; and 62/823,484, which are hereby incorporated by reference in their entirety.

BACKGROUND OF THE INVENTION

1. Field of the Invention

The present invention relates to plasma generators, and more particularly to devices for minimizing heat transfer from a plasma chamber to a waveguide.

2. Discussion of the Related Art

In recent years, microwave technology has been applied to generate various types of plasma. For instance, a microwave discharge, which is used as a plasma source, is achieved by coupling microwave energy into a discharge chamber containing gas to be processed. Typically, a microwave plasma system for processing or reforming gas includes a waveguide and a plasma chamber coupled to the waveguide.

In order for the microwave plasma system to operate efficiently, the temperature of the gas to be processed or reformed may be increased. As the temperature of the gas, and therefore the plasma chamber, is increased, excess amounts of heat energy is transferred from the plasma chamber to the waveguide by conduction. This heat transfer constitutes a loss of recoverable heat energy, therefore decreasing efficiency, while simultaneously heating up the waveguide and potentially damaging or shortening the lifespan of other components connected to the waveguide. The waveguide, magnetron, and any other components connected to the plasma chamber may become damaged, destroyed, or have a decreased lifespan should they operate above their maximum operating temperature.

As such, there is a need for devices that can minimize the heat transfer from the process gas (and plasma chamber) to the waveguide without compromising the temperature of the process gas (and plasma chamber).

SUMMARY OF THE INVENTION

According to one aspect of the present invention, a plasma generating system that includes: a waveguide for transmitting a microwave energy therethrough; an inner wall disposed within the waveguide to define a plasma cavity, a plasma being generated within the plasma cavity using the microwave energy; an adaptor mounted on a first side of the waveguide and physically separated from the waveguide by a first gap and having a gas outlet through which a gas processed by the plasma exits the plasma cavity; and an EM seal disposed in the first gap and configured to block leakage of the microwave energy through the first gap.

DETAILED DESCRIPTION OF THE PREFERRED EMBODIMENTS

In the following description, for purposes of explanation, specific details are set forth in order to provide an understanding of the disclosure. It will be apparent, however, to one skilled in the art that the disclosure can be practiced without these details. Furthermore, one skilled in the art will recognize that embodiments of the present disclosure, described below, may be implemented in a variety of ways.

Components, or modules, shown in diagrams are illustrative of exemplary embodiments of the disclosure and are meant to avoid obscuring the disclosure. It shall also be understood that throughout this discussion that components may be described as separate functional units, which may comprise sub-units, but those skilled in the art will recognize that various components, or portions thereof, may be divided into separate components or may be integrated together, including integrated within a single system or component. It should be noted that functions or operations discussed herein may be implemented as components.

Reference in the specification to "one embodiment," "preferred embodiment," "an embodiment," or "embodiments" means that a particular feature, structure, characteristic, or function described in connection with the embodiment is included in at least one embodiment of the disclosure and may be in more than one embodiment. Also, the appearances of the above-noted phrases in various places in the specification are not necessarily all referring to the same embodiment or embodiments.

The use of certain terms in various places in the specification is for illustration and should not be construed as limiting. The terms "include," "including," "comprise," and "comprising" shall be understood to be open terms and any lists the follow are examples and not meant to be limited to the listed items.

Figure 1:
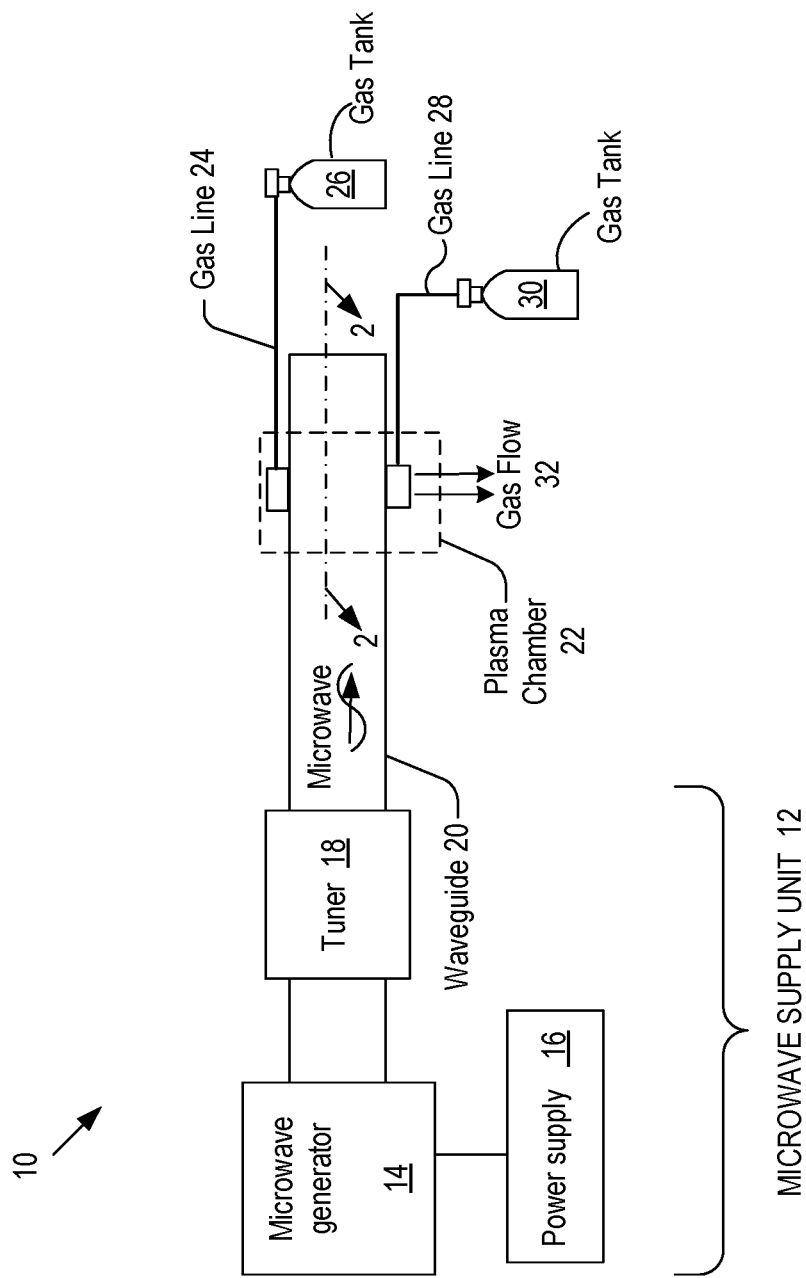
FIG. 1 ("FIG. 1") shows a schematic diagram of a plasma generating system according to embodiments of the present disclosure.

FIG. 1 ("FIG. 1") shows a schematic diagram of a plasma generating system 10 according to embodiments of the present disclosure. As depicted, the plasma generating system 10 includes: a microwave cavity/waveguide 20 having a shape of a hollow tube; a plasma chamber (also referred to as plasma reactor) 22 connected to the waveguide 20; and a microwave supply unit 12 connected to the waveguide 20 and operative to provide microwave energy to the plasma chamber 22 via a microwave waveguide 20. In embodiments, the plasma chamber 22 receives the microwave energy and processes gas by use of the received microwave energy. In embodiments, a gas tank 26 provides gas to the plasma chamber 22 via a gas line 24, and a gas tank 30 provides gas to the plasma chamber 22 via a gas line 28.

The microwave supply unit 12 provides microwave energy to the plasma chamber 22 and includes: a microwave generator 14 for generating microwaves; a power supply 16 for supplying power to the microwave generator 14; and a tuner 18 for reducing the microwave energy reflected from the plasma chamber 22 and travelling toward the microwave generator 14. In embodiments, the microwave supply unit 12 may include other components that are not shown in FIG. 1, such as an isolator having a dummy load for dissipating reflected microwave energy that propagates toward the microwave generator 14 and a circulator for directing the reflected microwave energy to the dummy load and a sliding short circuit disposed at the downstream end of the waveguide 20.

Figure 2:
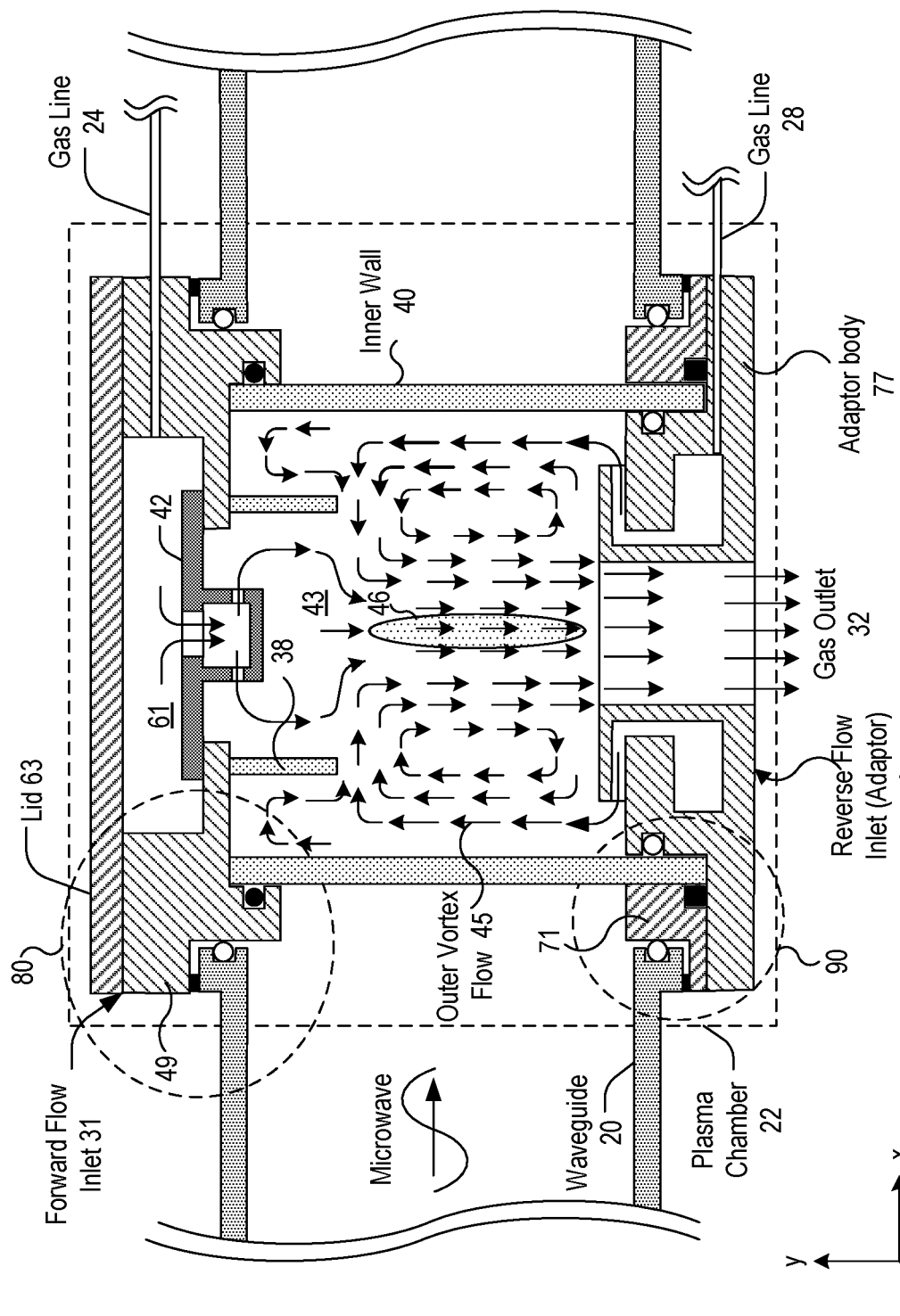
FIG. 2 shows a cross sectional view of a plasma chamber in FIG. 1, taken along the line 2-2, according to embodiments of the present disclosure.

FIG. 2 shows a cross sectional view of a plasma chamber 22 in FIG. 1, taken along the line 2-2, according to embodiments of the present disclosure. As depicted, the plasma chamber 22 includes: an inner wall(s) 40; a forward flow inlet 31 connected to the gas line 24 and configured to introduce forward gas flow into the plasma chamber; and an adaptor (which is al referred to as "reverse flow inlet") 74 connected to the gas line 28 and configured to introduce reverse gas flow into the plasma chamber. Here, the term plasma cavity refers to the enclosed space that is surrounded by the inner wall 40, waveguide 20, forward flow inlet 31 and adaptor 74, where the reverse flow gas and forward flows are processed/reformed in the plasma cavity by the microwave energy transmitted via the waveguide 20.

In embodiments, the inner wall 40 is formed of a material that is transparent to the microwave energy, such as quartz or ceramic. In embodiments, the inner wall 40 is formed of any other suitable dielectric material that is desirable for uniform flow, thermal resistance, chemical resistance, and electromagnetic transparency. In embodiments, the inner wall 40 has preferably, but not limited to, a shape of hollow circular cylinder.

In embodiments, the forward flow inlet 31 includes: a forward flow inlet body 49; a plasma stabilizer 38 mounted on a bottom surface of the forward flow inlet body 49; a vortex generator 42 mounted on the shoulder of the forward flow inlet body 49; and a lid 63 detachably secured to the forward flow inlet body 49 by a suitable fastening mechanism, such as screws/bolts (not shown in FIG. 2). In embodiments, the plasma stabilizer 38 is an optional element. The forward flow inlet body 49, lid 63, and vortex generator 42 define an enclosed space (also referred to as stagnation chamber) 61, where the gas from the gas line 24 enters the chamber 61 and subsequently exits through the vortex generator 42 toward the plasma 46.

Figure 3:
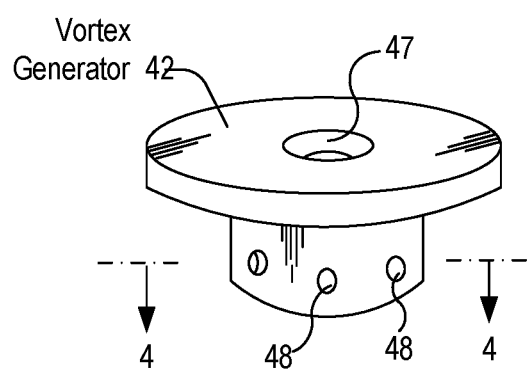
FIG. 3 shows a perspective view of a vortex generator according to embodiments of the present disclosure.
Figure 4:
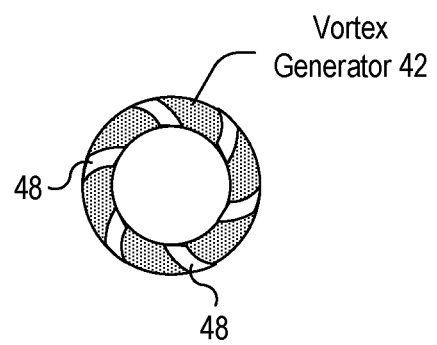
FIG. 4 shows a cross sectional view of the vortex generator in FIG. 3, taken along the line 4-4, according to embodiments of the present disclosure.

FIG. 3 shows a perspective view of the vortex generator 42 according to embodiments of the present disclosure. FIG. 4 shows a cross sectional view of the vortex generator 42, taken along the line 4-4, according to embodiments of the present disclosure. As depicted, the vortex generator 42 has a hole 47 through which the gas in the chamber 61 flows into the vortex generator 42. The vortex generator 42 also has one or more gas passageways 48 that are formed in the wall thereof. In embodiments, the exits of the gas passageways 48 are located inside the plasma stabilizer 38 so that the plasma stabilizer 38 forms an inner vortex flow 43 using the flow from the gas passageways 48. In embodiments, the inner diameter of the plasma stabilizer 38 may be varied to adjust the outer diameter of the inner vortex flow 43. In embodiments, as discussed above, the plasma stabilizer 38 may have a shape of hollow circular cylinder and disposed concentrically to the forward flow inlet 42.

In embodiments, each gas passageway 48 is arranged to impart spiral motion to the forward flow as the forward flow enters the plasma cavity via the gas passageway 48. In embodiments, each gas passageway 48 may be curved to enhance the vorticity of the forward flow. In embodiments, the vortex generator 42 is formed of any suitable dielectric material, such as ceramic, so that the vortex generator 42 is electrically isolated from the waveguide 20 and withstand the heat energy from the plasma 46. In embodiments, the vortex generator 42 is formed of metal or dielectric material.

In embodiments, the forward flow inlet body 49 is formed of metal such as Ni alloy (for instance, Inconel or Hastelloy). In embodiments, the lid 80 can be detached from the forward flow inlet body 49 for access to the components of the forward flow inlet 31.

Figure 7:
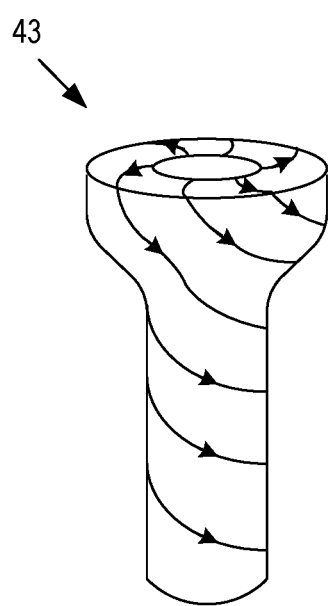
FIG. 7 shows a perspective view of an inner vortex flow according to embodiments of the present disclosure.

In embodiments, the plasma stabilizer 38 is formed of material that is transparent to the microwave energy, and preferably formed of the same material as the inner wall 40, such as quartz or ceramic. In embodiments, the plasma stabilizer 38 is mounted on the shoulder of the forward flow inlet body 49, and protrudes into the plasma cavity, where the axial direction of the plasma stabilizer 38 is parallel to the y-axis. In embodiments, as discussed above, the inner wall 40 may have a shape of a hollow circular cylinder and the plasma stabilizer 38 may be installed concentrically to the inner wall 40. In embodiments, the forward flow forms the inner vortex flow 43 and proceeds toward the other end of the waveguide 20, more specifically toward the gas outlet 32. FIG. 7 shows a perspective view of the inner vortex flow 43 according to embodiments of the present disclosure. As depicted, the forward flow (or equivalently, inner vortex flow) travels the length of the inner wall 40 in a helical motion until the inner vortex flow exits the gas outlet 32.

In embodiments, upon ignition of a plasma plume (or shortly, plasma) 46 by a plasma igniter (not shown in FIG. 2), the plasma 46 is sustained by the microwave energy transmitted by the microwave generator 14. The description of exemplary embodiments of the plasma igniter can be found in a copending U.S. patent application Ser. No. 16/805,661, entitled "Durable auto-ignition device for plasma reactor," filed on Feb. 28, 2020, which is hereby incorporated by reference in its entirety. In embodiments, the plasma 46 is located within the inner vortex flow 43 so that the gas particles of the inner vortex flow 43 pass through the plasma 46. As discussed above, the plasma stabilizer 38 determines the outer diameter of the inner vortex flow 43, preventing the forward flow from bypassing the plasma 46 before exiting the plasma cavity through the gas outlet 32. In embodiments, the plasma stabilizer 38 aids in keeping the plasma 46 stable.

Figure 5:
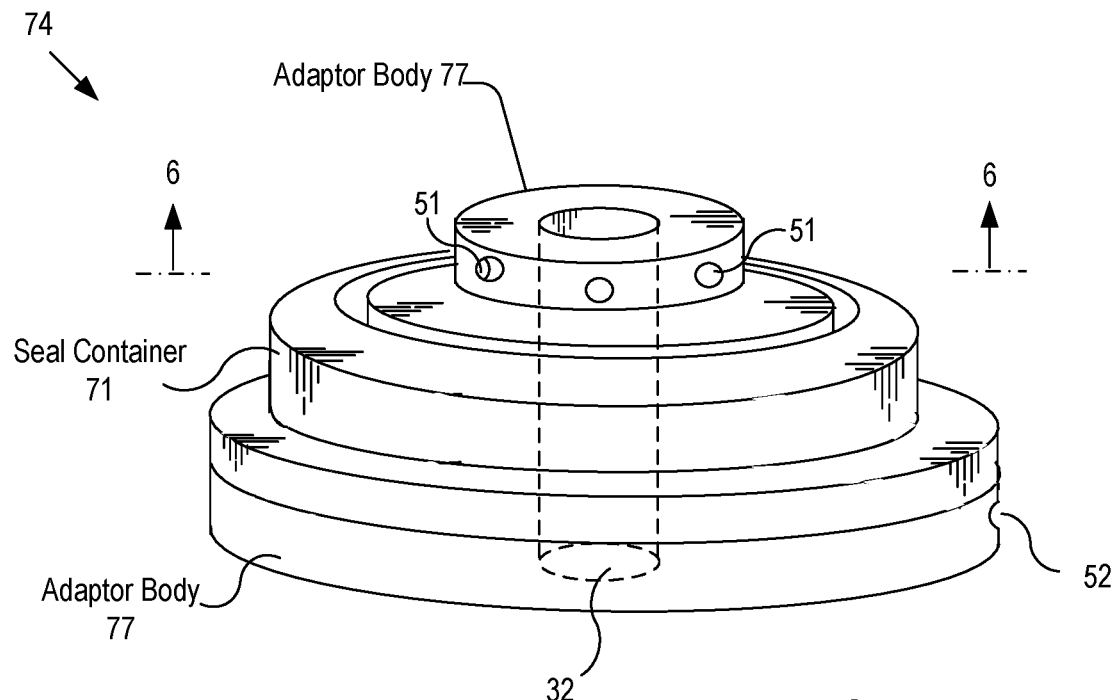
FIG. 5 shows a perspective view of an adaptor according to embodiments of the present disclosure.
Figure 6:
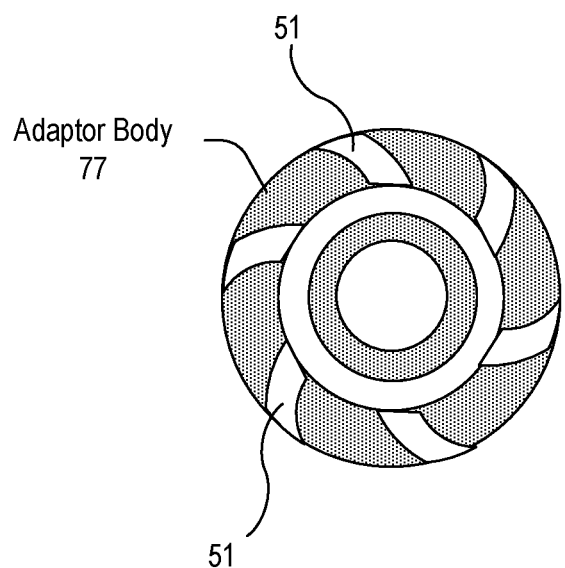
FIG. 6 shows a cross sectional view of the adaptor in FIG. 7, taken along the line 6-6, according to embodiments of the present disclosure.

FIG. 5 shows a perspective view of the adaptor 74 according to embodiments of the present disclosure. FIG. 6 shows a cross sectional view of the adaptor 74, taken along the line 6-6, according to embodiments of the present disclosure. As depicted, the adaptor 74 includes the adaptor body 77 and a seal container 71. In embodiments, the adaptor body 77 has a hole/adaptor 52 for coupling to the gas line 28, a hole to form the gas outlet 32, and one or more gas passageways 51 that are formed in the wall thereof. In embodiments, each gas passageway 51 is arranged to impart spiral motion to the reverse flow as the reverse flow enters the plasma cavity via the gas passageway 51. In embodiments, each gas passageway 51 is curved to enhance the vorticity of the reverse flow. In embodiments, the adaptor body 77 and the seal container 71 are formed of preferably, but not limited to Ni alloy, such as Inconel or Hastelloy.

Figure 8:
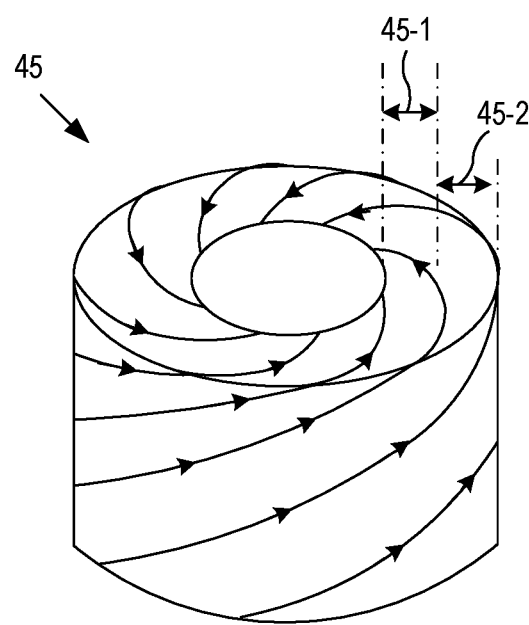
FIG. 8 shows a perspective view of an outer vortex flow according to embodiments of the present disclosure.

In embodiments, the reverse flow exiting the adaptor 74 travels toward to the inner wall 40 and then proceeds upwardly (y-axis direction) toward the other end of the waveguide 20 along the inner wall 40 in a helical motion. Subsequently, the reverse flow reverses the flow direction to proceed downwardly and form an outer vortex flow 45. In embodiments, the rotational axis of the outer vortex flow 45 is substantially parallel to the y-axis. FIG. 8 shows a perspective view of the outer vortex flow 45 according to embodiments of the present disclosure. As depicted, the outer vortex flow 45 has a hollow cylinder shape and has two flow regions: inner downward flow region 45-1 and an outer upward flow region 45-2. In embodiments, the inner vortex flow 43 is disposed in the middle hollow portion of the outer vortex flow 45 and surrounded by inner downward flow region 45-1. It is noted that the gas from the vortex generator 42 is mixed with the flow from the adaptor 74 to form the inner vortex flow 43.

In embodiments, the outer vortex flow 45 surrounds the inner vortex flow 43, to thereby shield the inner wall 40 from the plasma 46. In embodiments, the reverse flow exiting the adaptor 74 may have the ambient temperature and take heat energy from the inner wall 40 as the outer vortex flow 45 travels upwardly along the inner wall 40 in the helical motion.

In embodiments, as discussed above, the inner diameter of the plasma stabilizer 38 determines the radial dimension of the inner vortex flow 43. As such, in embodiments, the inner diameter of the plasma stabilizer 38 may be adjusted so that the outer vortex flow 45 surrounds the inner vortex flow 43 and maintain the flow regime of the inner vortex flow 43 in a stable manner to thereby stabilize the plasma and yield improved throughput and efficiency.

In embodiments, the plasma 46 is used to reform the inlet gas to the desired product gas, where the inlet gas is introduced into the plasma cavity by the forward flow inlet 31 and adaptor 74. In embodiments, the gas composition of the inner vortex flow exiting the vortex generator 42 includes $CO_2$, $CH_4$ and $O_2$, and the gas exiting the gas outlet 32 includes CO and $H_2$ as well as a non-reacted portion of forward flow gas. In embodiments, the preferred distribution for the forward flow is 5%-95% by mass of the total flow into the plasma chamber 22. In embodiments, the reverse flow may have the same gas composition of the forward flow. In alternative embodiments, the forward flow may have different gas composition from the reverse flow. Also, the gas composition of the forward flow (and/or reverse flow) may be changed during operation. For instance, the forward flow may include a slug of argon to aid ignition of the plasma 46. In embodiments, the gas compositions and flow rates of the forward and reverse flows may be adjusted to enhance the plasma stability and efficiency of the chemical reaction in the plasma chamber 22.

In embodiments, in order for the plasma generating system 10 to operate efficiently, the process gas flowing from the gas tanks to the adaptor 74 and/or forward flow inlet 31 may be heated by a suitable mechanism (not shown in FIG. 2) before entering the plasma cavity. As the process gas is at elevated temperatures, excess amounts of heat energy may be transferred to the plasma chamber 22, and subsequently to the waveguide 20 by conduction. Also, during the operation, the gas heated by plasma 46 transfers the heat energy to the adaptor 74 and the forward flow inlet 31, which in turn transfer the heat energy to the waveguide 20. Since this heat transfer may heat up the waveguide 20 and potentially damage or shorten the lifespan of other components of the microwave supply unit 12, in embodiments, the plasma chamber 22 is physically separated from the waveguide 20 by gaps, to thereby reduce the heat conduction.

Figure 9:
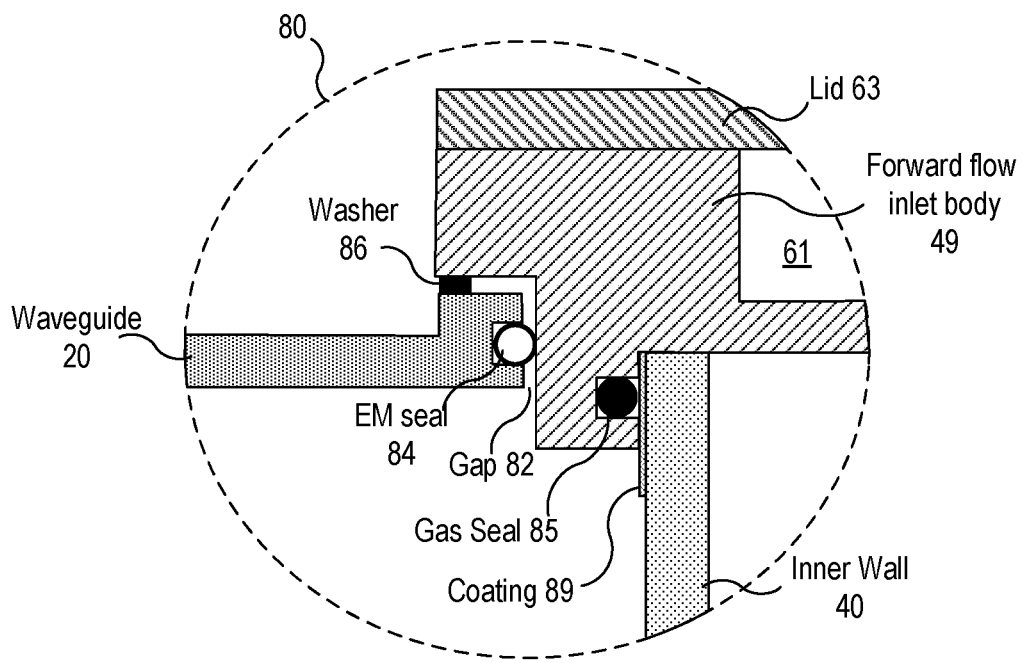
FIG. 9 shows an enlarged view of a portion of FIG. 2 according to embodiments of the present disclosure.

FIG. 9 shows an enlarged view of a portion 80 of FIG. 2 according to embodiments of the present disclosure. As depicted in FIG. 9, the forward flow inlet body 49 is separated from the waveguide 20 by a gap 82, to thereby reduce the heat transfer from the forward flow inlet body 49 to the waveguide 20 by conduction. The gap 82 is also desirable to account for manufacturing tolerances and thermal expansion of the forward flow inlet body 49. However, the microwave energy may leak through the gap 82 to thereby decrease the operational efficiency of the system 10, if the gap 82 is not electromagnetically sealed.

In embodiments, the gap 82 is sealed by a washer 86, where the washer 86 is formed of electrically conductive material, such as metal, but has a low thermal conductivity. The washer 86 reduces the heat transfer from the forward flow inlet body 49 to the waveguide 20 while minimizing/blocking the electromagnetic radiation leakage through the gap 82 (i.e. thermal isolation) between the forward flow inlet body 49 and the waveguide 20. In embodiments, the washer 86 is an electromagnetic (EM) seal and also reduces the heat transfer from the forward flow inlet body 49 to the waveguide 20. In embodiments, the width of the washer 86 may be minimized to reduce the area of contact with the waveguide 20 (and the forward flow inlet body 49), to thereby reduce the heat conduction from the forward flow inlet body to the waveguide.

Figure 10:
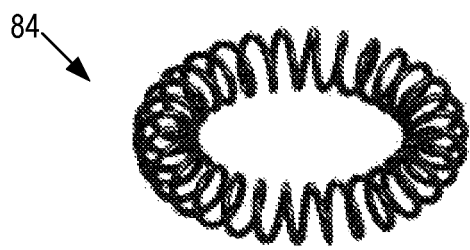
FIG. 10 shows a perspective view of an electromagnetic (EM) seal according to embodiments of the present disclosure.

In embodiments, other types of low surface area electromagnetic (EM) seals may be used to achieve the similar effect as the washer 86. For instance, the gap 82 is electromagnetically sealed by a wound coil of wire (which is also referred to as RF seal or EM seal), such as coil spring, 84. FIG. 10 shows a perspective view of the EM seal 84 according to embodiments of the present disclosure. In embodiments, the EM seal 84 sits in a notch formed in the waveguide 20 and contacts the forward flow inlet body 49, acting to prevent or reduce leakage of electromagnetic energy through the gap 82. In embodiments, the EM seal 84 is under moderate compression and has sufficient elasticity so as to accommodate thermal expansion and contraction of the gap 82. The EM seal 84 is formed of an electrically conductive material with sufficient mechanical stability at the elevated temperatures found in the plasma chamber 22 so as to be able to maintain contact between the forward flow inlet body 49 and the waveguide 20, before, during and after startup, operation and shutdown of the plasma chamber. In embodiments, it is preferred that the EM seal 84 is formed of a high temperature compatible material that does not exhibit excessive corrosion or mechanical fatigue at the operating temperature of the plasma chamber 22.

In embodiments, a gas seal 85 is used to prevent leakage of the gas in the plasma chamber 22 through a gap 82 between the forward flow inlet body 49 and the inner wall 40. In embodiments, the gas seal 85 is an O-ring and formed of elastomeric material, such as rubber or silicon, that is transparent to the microwave and does not deteriorate at high temperatures.

In some embodiments, the gas seal 85 may not be suitable for the elevated temperatures found in the forward flow inlet body 49. In such cases, a graphite gasket is used as the gas seal 85, where the graphite gasket has a rectangular ring shape and formed of a graphite material (i.e., the graphite gasket may have the same shape as the gas seal 99 in FIG. 11.). In embodiments, the graphite material may not be transparent to the microwave energy; instead, the graphite material may be heated by the absorption of the microwave energy. In embodiments, to prevent the microwave energy from reaching the gas seal 85, the inner wall 40 includes a coating 89 that is formed of metal, such as silver.

Figure 11:
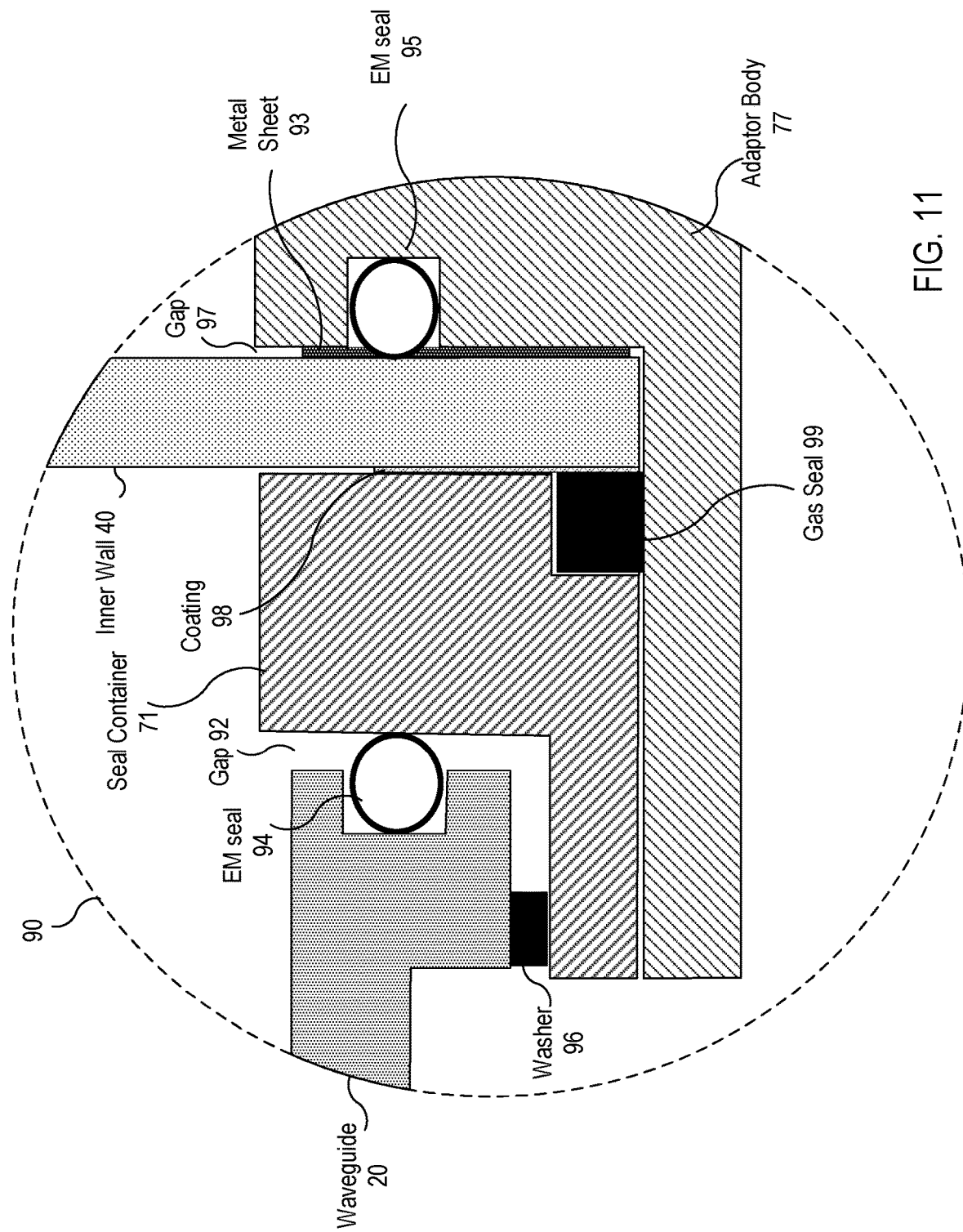
FIG. 11 shows an enlarged view of a portion of FIG. 2 according to embodiments of the present disclosure.

FIG. 11 shows an enlarged view of a portion 90 of FIG. 2 according to embodiments of the present disclosure. As depicted, the seal container 71 is mounted on and detachably secured to the adaptor body 77 by a suitable fastening mechanism (such as screw/bolt, not shown in FIG. 11), where the inner wall 40 is disposed between the seal container 71 and the adaptor body 77. In embodiments, the waveguide 20 is physically separated from the adaptor 74 (more specifically, the seal container 71) by a gap 92 to reduce the heat conduction from the seal container 71 to the waveguide 20. Also, the gap 92 is desirable to account for manufacturing tolerances and thermal expansion of the forward flow inlet 74. However, the microwave energy may leak through the gap 92, and as such, an EM seal 94 and/or washer 96 are used to prevent/reduce leakage of microwave energy through the gap 92. In embodiments, the EM seal 94 and the washer 96 have similar structures and functions as the EM seal 84 and the washer 86, respectively. In embodiments, the EM seal 94 and/or washer 96 is able to maintain contact between the seal container 71 and the waveguide 20, before, during and after startup, operation and shutdown of the plasma chamber.

It is noted that the seal container 71 may include a notch/groove where the EM seal 94 sits in. In such a case, the waveguide 20 may not include a notch or groove for the EM seal 94.

In embodiments, a gas seal 99 is used to prevent leakage of gas through the gap 97 between the inner wall 40 and the adaptor body 77. In embodiments, during operation, the temperature of the gas exiting the gas outlet 32 may reach up to 1200-1500° C., causing adaptor body 77 and seal container 71 to reach temperatures too hot to employ conventional elastomeric seals at the interface between the adaptor body 77 and the inner wall 40. In embodiments, the gas seal 99, which is formed of a high temperature compatible material, preferably but not limited to, graphite, is held in compression between the seal container 71 and the adaptor body 77 so as to block gas leakage through the gap 97. In embodiments, the seal container 71 has a notch/groove for the gas seal 99 and applies moderate compression to the gas seal 99 by using a suitable fastening mechanism, such as screw/bolt (not shown in FIG. 11). In embodiments, the gas seal 99 has a shape of rectangular ring shape, but it should be apparent to those of ordinary skill in the art that the gas seal 99 may have other suitable cross sectional shapes.

In embodiments, the gas seal 99, which may be formed of material that is not transparent to the microwave energy, is heated by the absorption of the microwave energy as well as the conduction from the adaptor body 77. In embodiments, to prevent the microwave energy from reaching the gas seal 99, the inner wall 40 includes a coating 98 that is formed of metal, such as silver.

In embodiments, another EM seal 95, which is similar to the RF seal 94, sits in a notch/groove in the adaptor body 77 and prevents the microwave energy from reaching the gas seal 99. In embodiments, a thin metal sheet 93 is optionally inserted in the gap 97 to further prevent the microwave energy from reaching the gas seal 99.

Figure 12:
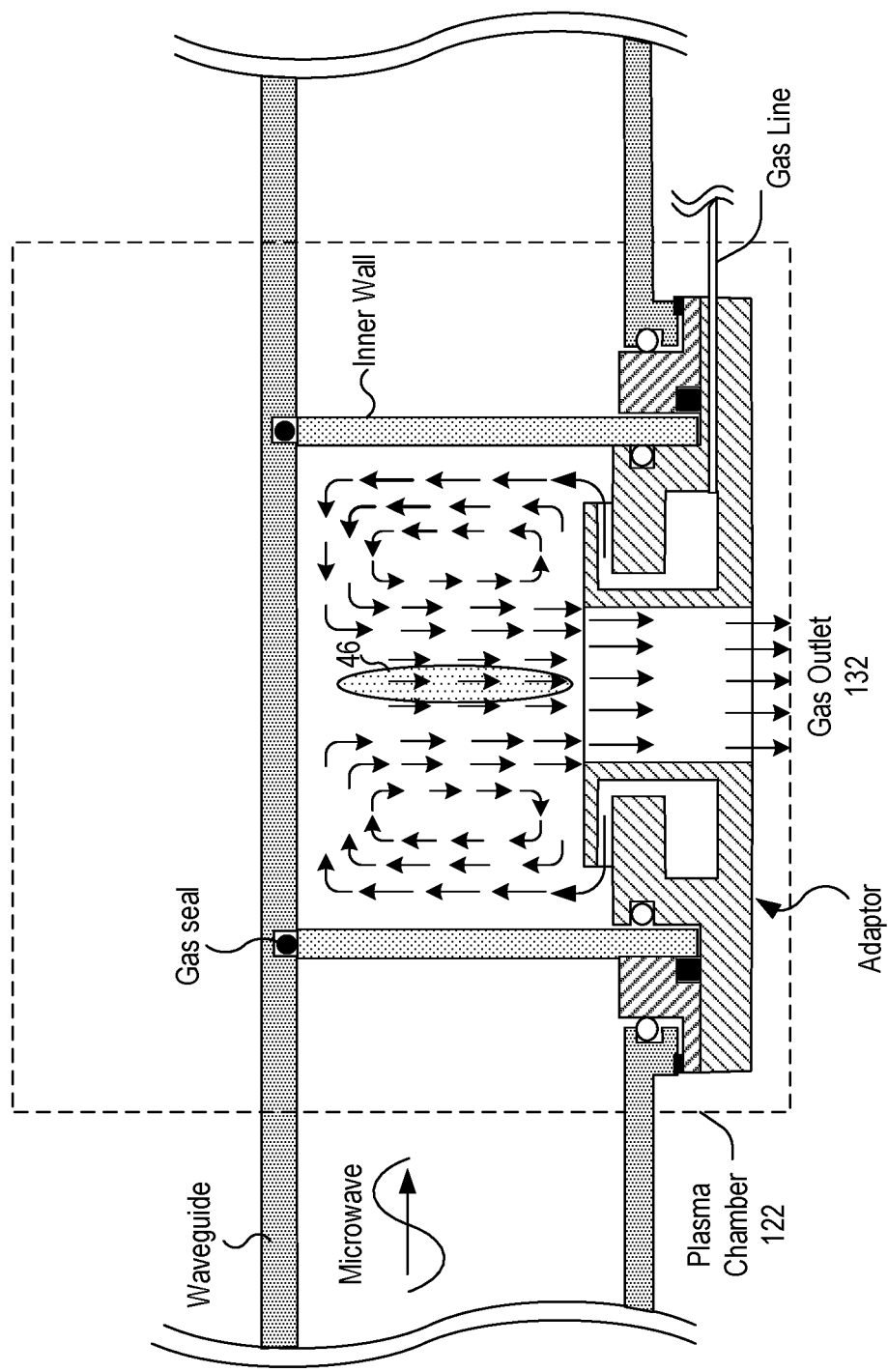
FIG. 12 shows a cross sectional view of a plasma chamber in FIG. 1, taken along the line 2-2, according to embodiments of the present disclosure.

It is noted that the plasma chamber 22 may have different components and arrangement of the components. For instance, FIG. 12 shows a cross sectional view of a plasma chamber in FIG. 1, taken along the line 2-2, according to embodiments of the present disclosure. As depicted, the plasma chamber 122 does not include the forward flow inlet, compared to the plasma chamber 22. Since the plasma chamber 122 does not have the forward flow inlet, the inner vortex that is similar to the vortex in FIG. 7 is not generated inside the plasma chamber 122.

Figure 13:
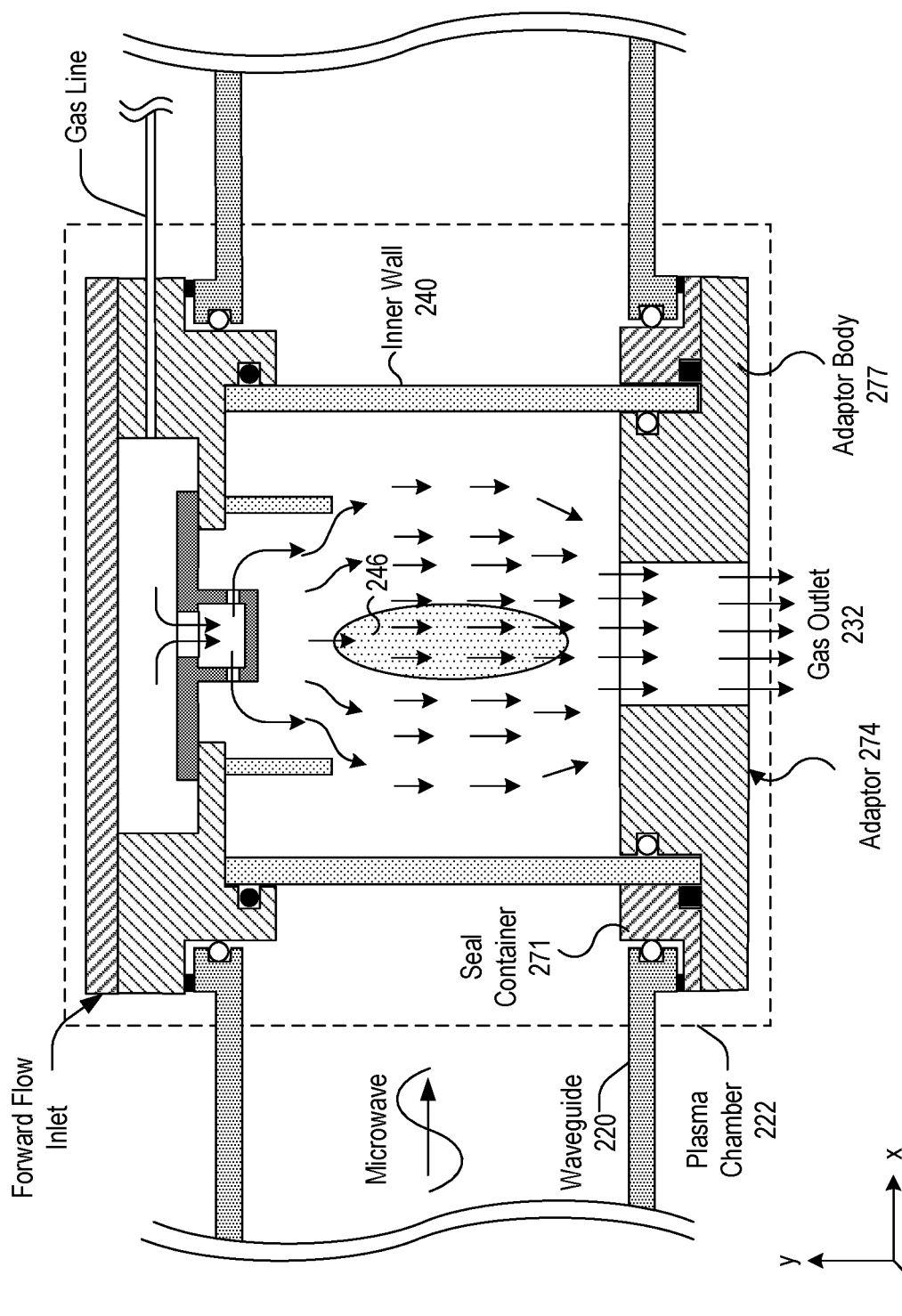
FIG. 13 shows a cross sectional view of a plasma chamber in FIG. 1, taken along the line 2-2, according to embodiments of the present disclosure.

In another example, FIG. 13 shows a cross sectional view of a plasma chamber in FIG. 1, taken along the line 2-2, according to embodiments of the present disclosure. As depicted, the plasma chamber 222 is similar to the plasma chamber 22, with the difference that the adaptor body 77 is replaced by an adaptor body 277, where the adaptor 277 body does not have any gas passageway therein. Also, since the adaptor body 277 does not have any gas passageway therein, the adaptor 274 is not coupled to a gas line. It is noted that the reverser flow inlet 274 does not introduce gas into the plasma cavity, and as a consequence, the outer vortex that is similar to the vortex in FIG. 8 is not generated inside the plasma chamber 222.

In embodiments, except the adaptor body 277, the components of the plasma chamber 222 have the similar functions and structures as their counterparts of the plasma chamber 22. For instance, the seal container 271 is physically separated from the waveguide 220, and a washer and/or an EM seal are used to prevent leakage of the microwave through the gap. It is noted that the plasma chambers 122 and 222 are exemplary variations of the plasma chamber 22. The description of various embodiments of the plasma chamber can be found in a copending U.S. patent application Ser. No. 16/752,689, entitled "Plasma reactor for processing gas," filed on Jan. 26, 2020, and Ser. No. 16/790,644, entitled "Controlling exhaust gas pressure of a plasma reactor for plasma stability," filed on Feb. 13, 2020, which are hereby incorporated by reference in their entirety.

Figure 14:
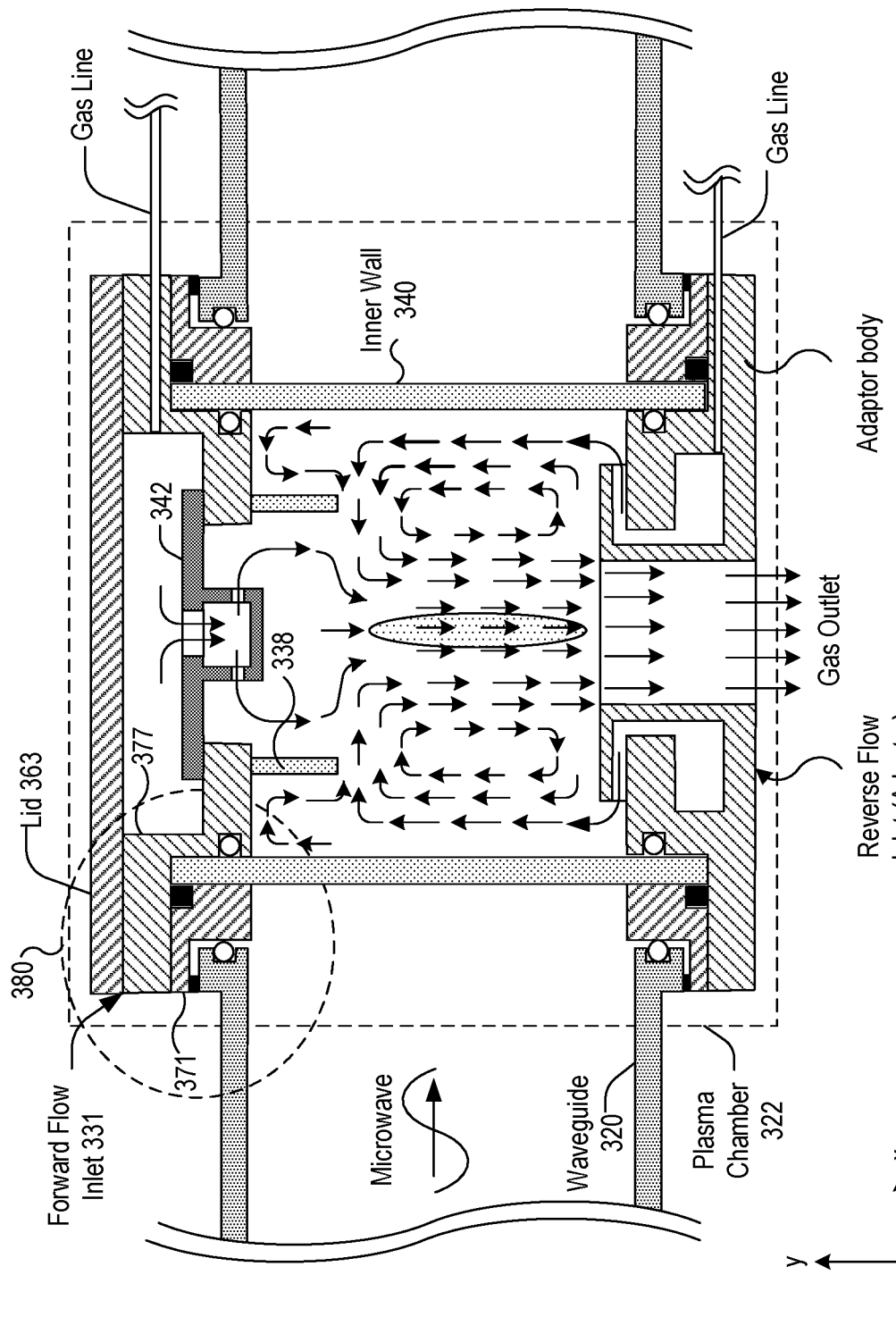
FIG. 14 shows a cross sectional view of a plasma chamber in FIG. 1, taken along the line 2-2, according to embodiments of the present disclosure.
Figure 15:
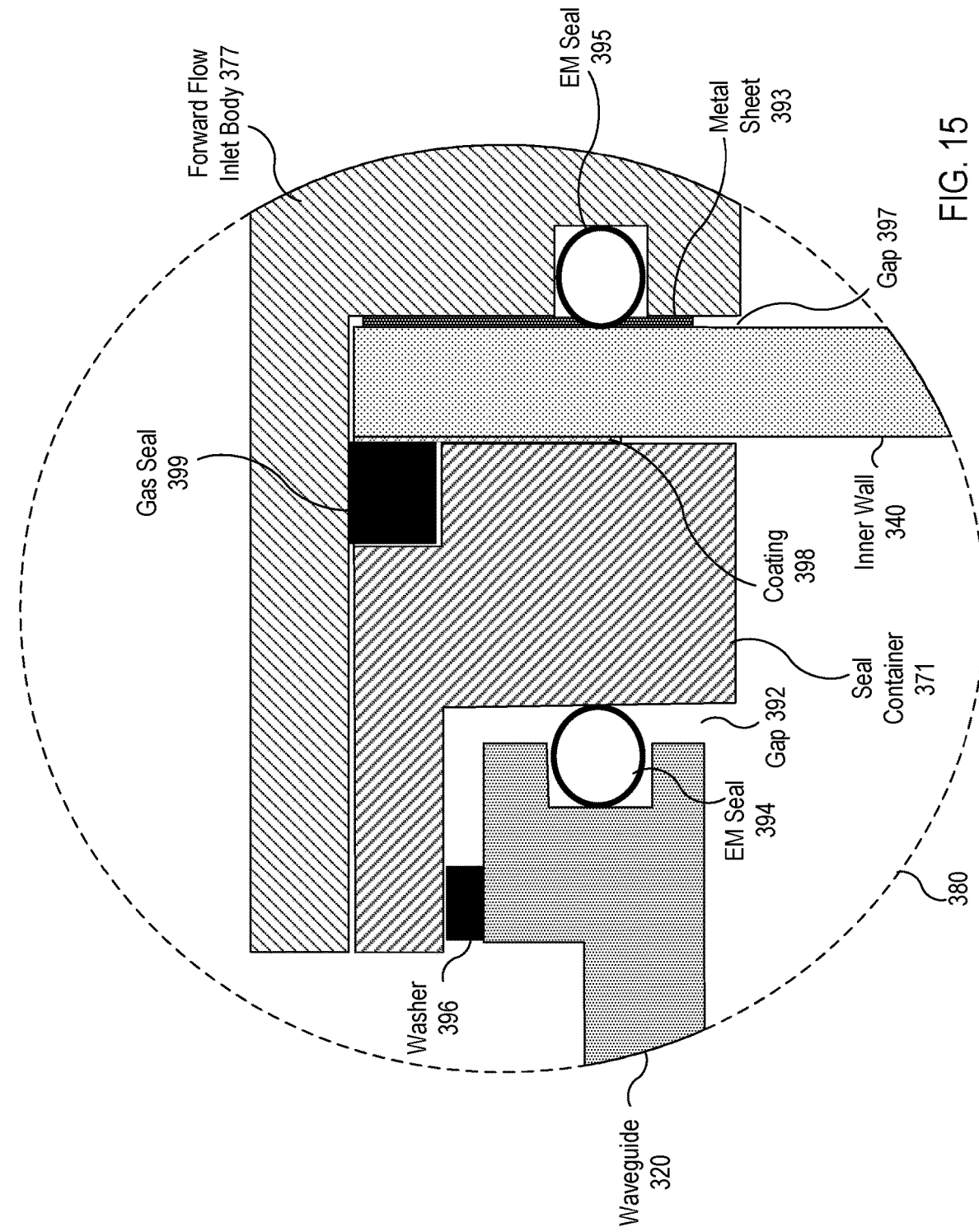
FIG. 15 shows an enlarged view of a portion of FIG. 14 according to embodiments of the present disclosure.

FIG. 14 shows a cross sectional view of a plasma chamber in FIG. 1, taken along the line 2-2, according to embodiments of the present disclosure. FIG. 15 shows an enlarged view of a portion of FIG. 14 according to embodiments of the present disclosure. As depicted, the plasma chamber 322 is similar to the plasma chamber 22 in FIG. 2, with the difference that the forward flow body 377 has a different geometry from the forward flow inlet body 49. In embodiments, the forward flow inlet 331 includes: a forward flow inlet body 377; a seal container 371 detachably secured to the forward flow inlet body 377 by a suitable fastening mechanism, such as screws/bolts (not shown in FIG. 14); a plasma stabilizer 338 mounted on a bottom surface of the forward flow inlet body 377; a vortex generator 342 mounted on the shoulder of the forward flow inlet body 377;

and a lid 363 detachably secured to the forward flow inlet body 377 by a suitable fastening mechanism, such as screws/bolts (not shown in FIG. 14).

In embodiments, the inner wall 340 is disposed between the seal container 371 and the forward flow inlet body 377. In embodiments, the waveguide 320 is physically separated from the forward flow inlet 331 (more specifically, the seal container 371) by a gap 392 to reduce the heat conduction from the seal container 371 to the waveguide 320. Also, the gap 392 is desirable to account for manufacturing tolerances and thermal expansion of the forward flow inlet 331. However, the microwave energy may leak through the gap 392, and as such, an EM seal 394 and/or washer 396 are used to prevent/reduce leakage of microwave energy through the gap 392. In embodiments, the EM seal 394 and the washer 396 have similar structures and functions as the EM seal 84 and the washer 86, respectively. For instance, the washer 396 is an EM seal that reduces heat transfer from the forward flow inlet 331 to the waveguide 320. In embodiments, the EM seal 394 and/or washer 396 is able to maintain contact between the seal container 371 and the waveguide 320, before, during and after startup, operation and shutdown of the plasma chamber.

It is noted that the seal container 371 may include a notch/groove where the EM seal 394 sits in. In such a case, the waveguide 320 may not include a notch or groove for the EM seal 394.

In embodiments, a gas seal 399 is an O-ring made of elastomeric material and is used to prevent leakage of gas through the gap 397 between the inner wall 340 and the forward flow inlet body 377. In some embodiments, during operation, the gas inside the plasma cavity may be at elevated temperatures, causing the forward flow inlet body 377 and seal container 371 to reach temperatures too hot to employ conventional elastomeric seals at the interface between the forward flow inlet body 377 and the inner wall 340. In embodiments, the gas seal 399, which is formed of a high temperature compatible material, preferably but not limited to, graphite, is held in compression between the seal container 371 and the forward flow inlet body 377 so as to block gas leakage through the gap 397. In embodiments, the seal container 371 has a notch/groove for the gas seal 399 and applies moderate compression to the gas seal 399 by using a suitable fastening mechanism, such as screw/bolt (not shown in FIG. 15). In embodiments, the gas seal 399 has a shape of rectangular ring shape, but it should be apparent to those of ordinary skill in the art that the gas seal 399 may have other suitable cross sectional shapes.

In embodiments, the gas seal 399, which may be formed of material that is not transparent to the microwave energy, is heated by the absorption of the microwave energy as well as the conduction from the forward flow inlet body 377. In embodiments, to prevent the microwave energy from reaching the gas seal 399, the inner wall 340 includes a coating 398 that is formed of metal, such as silver.

In embodiments, another EM seal 395, which is similar to the RF seal 94, sits in a notch/groove in the forward flow inlet body 377 and prevents the microwave energy from reaching the gas seal 399. In embodiments, a thin metal sheet 393 is optionally inserted in the gap 397 to further prevent the microwave energy from reaching the gas seal 399.

It will be appreciated to those skilled in the art that the preceding examples and embodiments are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure. It shall also be noted that elements of any claims may be arranged differently including having multiple dependencies, configurations, and combinations.

What is claimed is:

1. A plasma generating system, comprising:
    a waveguide for transmitting a microwave energy therethrough;
    an inner wall disposed within the waveguide to define a plasma cavity, a plasma being generated within the plasma cavity using the microwave energy;
    an adaptor mounted on a first side of the waveguide and physically separated from the waveguide by a first gap and having a gas outlet through which a gas processed by the plasma exits the plasma cavity; and
    a first electromagnetic (EM) seal disposed in the first gap and configured to block leakage of the microwave energy through the first gap.

2. A plasma generating system as recited in claim 1, wherein the first electromagnetic (EM) seal is a washer.

3. A plasma generating system as recited in claim 1, wherein the first electromagnetic (EM) seal is a coil spring.

4. A plasma generating system as recited in claim 1, wherein the adaptor includes:
    an adaptor body having the gas outlet;
    a seal container detachably secured to the adaptor body and having a notch, the inner wall being disposed between the adaptor body and the seal container; and
    a gas seal disposed in the notch and configured to block a leakage of gas through a second gap between the adaptor body and the inner wall.

5. A plasma generating system as recited in claim 4, wherein the gas seal is formed of a graphite.

6. A plasma generating system as recited in claim 4, further comprising;
    a coating formed on a portion of the inner wall and made of a material that blocks microwave energy and configured to prevent microwave energy from reaching the gas seal.

7. A plasma generating system as recited in claim 4, further comprising;
    a second electromagnetic (EM) seal disposed in the second gap and configured to prevent microwave energy from reaching the gas seal.

8. A plasma generating system as recited in claim 7, wherein the second electromagnetic (EM) seal is a coil spring.

9. A plasma generating system as recited in claim 4, further comprising;
    a metal sheet disposed in the second gap and configured to prevent microwave energy from reaching the gas seal.

10. A plasma generating system as recited in claim 4, wherein the adaptor body includes a hole for receiving an input gas from outside of the adaptor and is configured to generate a vortex flow within the plasma cavity using the input gas.

11. A plasma generating system as recited in claim 10, wherein the adaptor body has one or more passageways through which the input gas is introduced into the plasma cavity and each of the one or more passageways is arranged to impart a vortical motion to the input gas that passes therethrough.

12. A plasma generating system as recited in claim 1, further comprising:

a flow inlet mounted on a second side of the waveguide and configured to introduce an input gas into the plasma cavity and generate a vortex flow within the plasma cavity using the input gas, the flow inlet being physically separated from the waveguide by a third gap.

13. A plasma generating system as recited in claim 12, further comprising:
a third electromagnetic (EM) seal mounted in the third gap and configured to block leakage of microwave energy through the third gap.

14. A plasma generating system as recited in claim 13, wherein the third electromagnetic (EM) seal is a washer.

15. A plasma generating system as recited in claim 14, wherein the washer is formed of an electrically conducting material.

16. A plasma generating system as recited in claim 13, wherein the third electromagnetic (EM) seal is a coil spring.

17. A plasma generating system as recited in claim 12, wherein the flow inlet includes:
a flow inlet body having a hole for receiving the input gas from outside of the flow inlet;
a lid detachably secured to the flow inlet body and defining an enclosed chamber that is in fluid communication with the hole in the flow inlet body; and
a vortex generator mounted on the flow inlet body and having a hole that is in fluid communication with the chamber and configured to generate the vortex flow within the plasma cavity using the input gas.

18. A plasma generating system as recited in claim 17, wherein the vortex generator includes one or more passageways through which the input gas flows and each of the one or more passageways is arranged to impart a vortical motion to the input gas that passes therethrough.

19. A plasma generating system as recited in claim 17, further comprising:
a gas seal disposed in a fourth gap between the inner wall and the flow inlet body and configured to seal leakage of gas through the fourth gap.

20. A plasma generating system as recited in claim 19, wherein the gas seal is formed of elastomeric material.

21. A plasma generating system as recited in claim 19, wherein the gas seal is formed of a graphite.

22. A plasma generating system as recited in claim 19, further comprising;
a coating formed on a portion of the inner wall and made of a material that blocks microwave energy and configured to prevent microwave energy from reaching the gas seal.

23. A plasma generating system as recited in claim 17, further comprising:
a seal container detachably secured to the flow inlet body and having a notch, the inner wall being disposed between the flow inlet body and the seal container; and
a gas seal disposed in the notch and configured to block a leakage of gas through a fourth gap between the flow inlet body and the inner wall.

24. A plasma generating system as recited in claim 23, wherein the gas seal is formed of a graphite.

25. A plasma generating system as recited in claim 23, further comprising:
a coating formed on a portion of the inner wall and made of a material that blocks microwave energy and configured to prevent microwave energy from reaching the gas seal.

26. A plasma generating system as recited in claim 23, further comprising;
a second electromagnetic (EM) seal disposed in the fourth gap and configured to prevent microwave energy from reaching the gas seal.

27. A plasma generating system as recited in claim 26, wherein the second electromagnetic (EM) seal is a coil spring.

28. A plasma generating system as recited in claim 23, further comprising;
a metal sheet disposed in the fourth gap and configured to prevent microwave energy from reaching the gas seal.

* * * * *